(12) United States Patent
Kikuchi et al.

(10) Patent No.: US 8,072,802 B2
(45) Date of Patent: Dec. 6, 2011

(54) MEMORY EMPLOYING REDUNDANT CELL ARRAY OF MULTI-BIT CELLS

(75) Inventors: Keiichiro Kikuchi, Kitakata (JP);
Norihiko Yamaki, Aizuwakamatsu (JP);
Hiroaki Wada, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 196 days.

(21) Appl. No.: 12/329,475

(22) Filed: Dec. 5, 2008

(65) Prior Publication Data

US 2010/0142269 A1 Jun. 10, 2010

(51) Int. Cl.
*G11C 16/04* (2006.01)
(52) U.S. Cl. ............ 365/185.03; 365/185.09; 365/185.2; 365/185.29
(58) Field of Classification Search ............. 365/185.03, 365/185.09, 185.2, 185.29
See application file for complete search history.

(56) References Cited

U.S. PATENT DOCUMENTS

| | | | |
|---|---|---|---|
| 6,021,066 A | 2/2000 | Lam | |
| 6,751,131 B2 * | 6/2004 | Yamano | 365/189.07 |
| 6,822,909 B1 | 11/2004 | Hamilton et al. | |
| 6,853,596 B2 * | 2/2005 | Cheung | 365/200 |
| 7,120,062 B2 | 10/2006 | La Malfa et al. | |
| 7,120,063 B1 | 10/2006 | Liu et al. | |
| 7,324,374 B2 | 1/2008 | Shieh et al. | |
| 7,359,261 B1 * | 4/2008 | Wu et al. | 365/200 |
| 7,372,743 B2 | 5/2008 | Yano et al. | |
| 7,385,851 B1 | 6/2008 | Park et al. | |
| 7,433,228 B2 | 10/2008 | Kuo et al. | |
| 7,725,762 B2 * | 5/2010 | Bartley et al. | 714/5 |

FOREIGN PATENT DOCUMENTS

JP 2000-173279 6/2000

* cited by examiner

*Primary Examiner* — Pho M. Luu
(74) *Attorney, Agent, or Firm* — Matthew M. Gaffney; Frommer Lawrence & Haug LLP (57) ABSTRACT

A memory that employs a redundant cell array for recovery of one or more failed core cell arrays of multi-bit memory cells is described. The memory includes a plurality of core cell arrays, at least one redundant cell array, and a memory controller. The memory controller is configured to dynamically assign the redundant cell array to a failed core cell array when erasing at least a portion of the plurality of core cell arrays. The memory controller is further configured to provide read/write access to the redundant cell array when the failed core cell array is selected for read/write access.

20 Claims, 9 Drawing Sheets

MEMORY EMPLOYING REDUNDANT CELL ARRAY OF MULTI-BIT CELLS

FIELD OF THE INVENTION

The invention is related to a memory architecture, and in particular but not exclusively, to an architecture for recovering core cell arrays of multi-bit memory cells.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a memory controller reads from and/or writes to an individual memory element by receiving and transmitting signals over the bit and word lines of the memory.

In many flash-based memories, multi-bit memory cells are employed. Such memory cells conserve footprint and enhance read/write speeds by storing at least two bits of data at a given memory cell. For example, a dual-bit memory cell can conserve footprint and enhance speed by storing up to four different logic states.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on.

The term "read" as used herein refers to one or more processes for determining one or more logic states associated with one or more memory cells. In one embodiment, a logic state may be associated with a binary datum indicative of a "1" or "0." For example, a logic value of "1" can be assigned to a programmed portion of a memory cell and a logic value of "0" can be assigned to an unprogrammed portion of a memory cell. The term "write" as used herein refers to one or more processes for setting a logic state of one or more memory cells. For example, a write can include changing a portion of a memory cell from an unprogrammed state to a programmed state (or vice versa). The term "erase" as used herein refers to one or more processes for changing a logic state of one or more memory cells to an unprogrammed state. For example, an erase can be employed to simultaneously erase an array of memory cells or an entire sector of memory cells.

The term "pre-program" as used herein refers to one or more write processes that are employed in conjunction with an erase process to prevent over-erasure of memory cells. For example, pre-programming can bring unprogrammed memory cells into a programmed state prior to an erase process to prevent over-erasure. In one embodiment, pre-programming can also be employed in conjunction with a read process to identify individual memory cells for pre-programming. The term "soft program" as used herein refers to one or more write processes that are employed in conjunction with an erase process to correct over erasure of memory cells. For example, soft programming can bring over-erased memory cells into an unprogrammed state to correct over-erasure after an erase process. In one embodiment, soft programming can also be employed in conjunction with a read process to indentify individual memory cells for soft programming. The term "under-erase verify" as used herein refers to one or more read processes that are employed in conjunction with a soft programming process. For example, under-erase verify can determine whether soft programming brought an over-erased memory cell into a programmed state and/or an under programmed state.

Briefly stated, the invention is related to a memory architecture employing a redundant cell array for recovery of one or more failed core cell arrays of multi-bit memory cells. The memory includes a plurality of core cell arrays, at least one redundant cell array, and a memory controller. The memory controller is configured to dynamically assign the redundant cell array to a failed core cell array when erasing at least a portion of the plurality of core cell arrays. The memory controller is further configured to provide read/write access to the redundant cell array when the failed core cell array is selected for read/write access.

In one embodiment, the memory includes at least one dynamic reference cell array, and the memory controller is further configured to indentify a core cell array as a failed core cell array by writing a logic state to a dynamic reference cell of the dynamic reference cell array. In another embodiment, the core cell array, redundant cell array, and/or dynamic reference cell array employ multi-bit memory cells, such as dual-bit memory cells.

Figure 1:
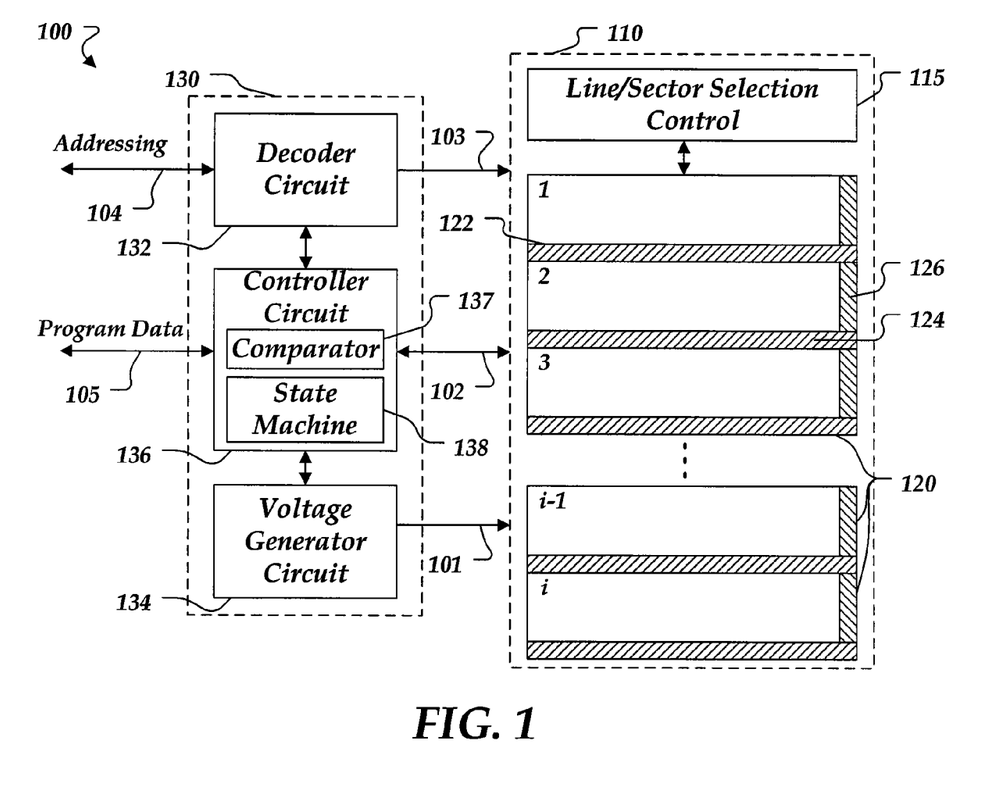
FIG. 1 is a block diagram of an embodiment of a memory.

FIG. 1 shows a memory environment in which embodiments of the invention may be employed. Not all the components illustrated in the figures may be required to practice the invention, and variations in the arrangement and type of the components may be made without departing from the spirit or scope of the invention. In addition, although primarily discussed in the context of a flash-based memory having dual-bit memory cells, other types of memory and/or configurations of memory cells are possible. For example, other types of multi-bit memory cells can be employed.

As shown, memory 100 includes arrayed memory 110 and memory controller 130. Arrayed memory 110 is arranged to receive and/or transmit signals over signal/bus lines 101-103. Arrayed memory 110 includes line/sector control circuit 115 and memory sectors 120 (identified individually as sectors 1-$i$). Memory sectors 120 can include, for example, 256, 512, 1024, or more sectors having memory cells that can be individually or collectively accessed via line/sector control circuit 115. In other examples, the number and/or arrangement of memory sectors can be different. In one embodiment, for example, sectors 120 can be referred to more generally as memory blocks, and line/sector control circuit 115 can be configured to have a configuration that is different than a bit line, word line, source gate line and/or sector topology.

Each sector of sectors 120 includes core cell arrays 122, at least one reference cell array 124, and at least one dynamic reference cell array 126. As will be described in more detail below, redundant cell array 124 can be employed to recover a core cell array that contains a failed memory cell, and dynamic cell array 126 can be employed to associate the core cell array with redundant cell array 124.

Memory controller 130 includes decoder circuit 132, voltage generator circuit 134, and controller circuit 136. In one embodiment, memory controller 130 may be located on the same chip as arrayed memory 110. In another embodiment, memory controller 110 may be located on a different chip, or portions of memory controller 110 may be located on another chip or off chip. For example, decoder circuit 132, controller circuit 134, and voltage generator circuit 136 can be located on different chips but co-located on the same circuit board. In other examples, other implementations of memory controller 130 are possible. For example, memory controller 130 can include a programmable microcontroller.

Decoder circuit 132 is arranged to receive memory addresses via signal/bus line 104 and to select individual sectors, arrays, or cells according to the architecture of arrayed memory 110. For example, in a RAM-based architecture, decoder circuit 132 can be configured to select memory cells individually or collectively from a sector for read/write access. Alternatively, in a ROM-based memory architecture, decoder circuit 132 might not select memory cells individually but can provide read/write access to entire cell arrays (or pages) of memory cells.

Decoder circuit 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator circuit 134 is arranged to receive one or more supply voltages (not shown) and to provide a variety of reference voltages required for the various operations of controller 136 and/or other components of memory 100. In one embodiment, controller 136 is configured to control the voltages provided by voltage generator circuit 134. For example, voltage generator circuit 134 can include one or more amplifier circuits, regulator circuits, and/or switch circuits that can be controlled by controller circuit 136.

Controller circuit 136 is arranged to receive and transmit data from an upstream system controller (not shown). Such a system controller can include, for example, a processor and a static random access memory (SRAM) that can be loaded with executable processor instructions for communicating addressing data over signal/bus line 104 and program data over signal/bus line 105. In some embodiments, controller circuit 136 as well as other portions of memory controller 130 may be embedded or otherwise incorporated into a system controller or a portion of a system controller.

Controller circuit 136 includes state machine 137 and comparator component 138. Comparator component 138 can include, for example, comparator circuits, amplifier circuits, combination logic, or the like for providing an output signal by comparing signals received from arrayed memory 110 and/or from voltage generator circuit 134. In one embodiment, comparator component 138 is arranged to compare voltage signals. In another embodiment, comparator component 138 is arranged to compare current signals.

State machine 137 can include any of a variety of components for invoking any of a myriad of algorithms to read, write, erase, pre-program, soft program, and/or under-erase verify. State machine 137 can also be configured to invoke an algorithm for addressing memory cells and coordinating operations for reading, writing, erasing, pre-programming, soft programming, and/or under-erase verifying. In one embodiment, addressing may generally be carried out in conjunction with address signals received at signal/bus line 104. In other embodiments, other types of circuits can be employed for implementing addressing, reading, writing, erasing, pre-programming, soft programming, and/or under-erase verifying operations.

Figure 2:
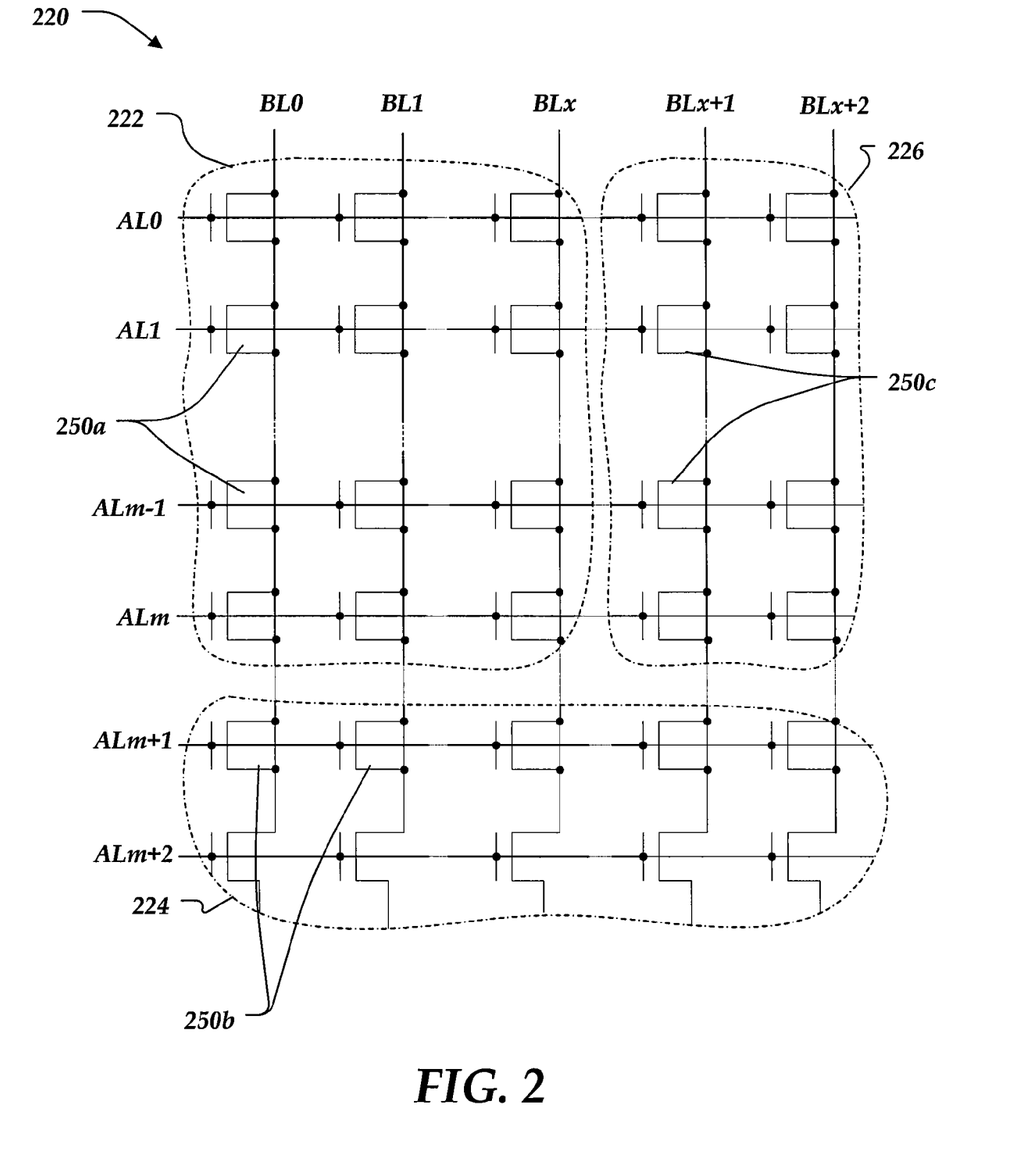
FIG. 2 is a schematic diagram of an embodiment of a memory sector.

FIG. 2 shows a schematic diagram of a memory sector. In one embodiment, sector 220 may be an embodiment of sector 120 of FIG. 1.

Sector 220 includes core cell arrays 222 of core memory cells 250$a$, at least one redundant cell array 224 of redundant memory cells 250$b$, and at least one dynamic reference cell array 226 of dynamic reference cells 250$c$. In general, individual core cell arrays 222 are associated with one or more groupings of access lines AL0-ALm (e.g., word lines and/or source gate lines), and/or bit lines BL0-BLx. In one embodiment, each access line defines a cell array. In another embodiment, two access lines define a cell array. In yet another embodiment, multiple access lines and separate grouping of bit lines BL0-BLx define a cell array.

Redundant cell array 224 is associated with access lines ALm+1 and Alm+2 and bit lines BL0-Blx2. Dynamic reference cell array 226 is associated with access lines AL0-ALm+2 and bit lines BLx+1-BLx+2. In other embodiments, cell arrays may be added or omitted to redundant cell array 224 and/or dynamic cell array 226. For example, the dynamic cell array associated with bit line BLx+2 may be omitted in one embodiment, and the reference cell array associated with access line ALm+2 may be omitted in another embodiment.

In general, individual memory cells within core cell arrays 222, redundant cell array 224, and dynamic reference cell array 226 receive one or more control signals over a corresponding access line and data is transmitted/receive over a corresponding bit line. In one embodiment, line/sector control 115 and decoder circuit 132 of FIG. 1 can be employed to address one or more arrays of cells, and controller circuit 136 and voltage generator circuit 134 can read, write, pre-program, erase, soft-program, and/or or under-erase verify the addressed array(s) of cells. For example, one or more columns of memory cells can be collectively accessed for one or more of such operations.

Also, memory sector 220 may include any of a variety of intermediary circuit elements for accessing individual memory cells or arrays of memory cells. For example, each array within memory sector 220 may include one or more select transistors coupled to the source/drain ends of the transistor chains in core cell arrays 222. In one embodiment, a select transistor is generally similar in structure to a core cell but is configured for providing read write access to core memory cells. In another embodiment, a select transistor may be configured differently.

Further, memory sectors may have other configurations. In one embodiment a sector may have a NOR configuration, where each cell can be accessed individually. In another embodiment, a sector may have a NAND configuration, where grouping of cells can be accessed collectively. In other embodiments, hybrid architectures including a NAND portion and a NOR portion may be employed. For example, a hybrid architecture can include NAND-based core cell and redundant cell arrays and one or more NOR-based dynamic reference cell arrays.

Figure 3:
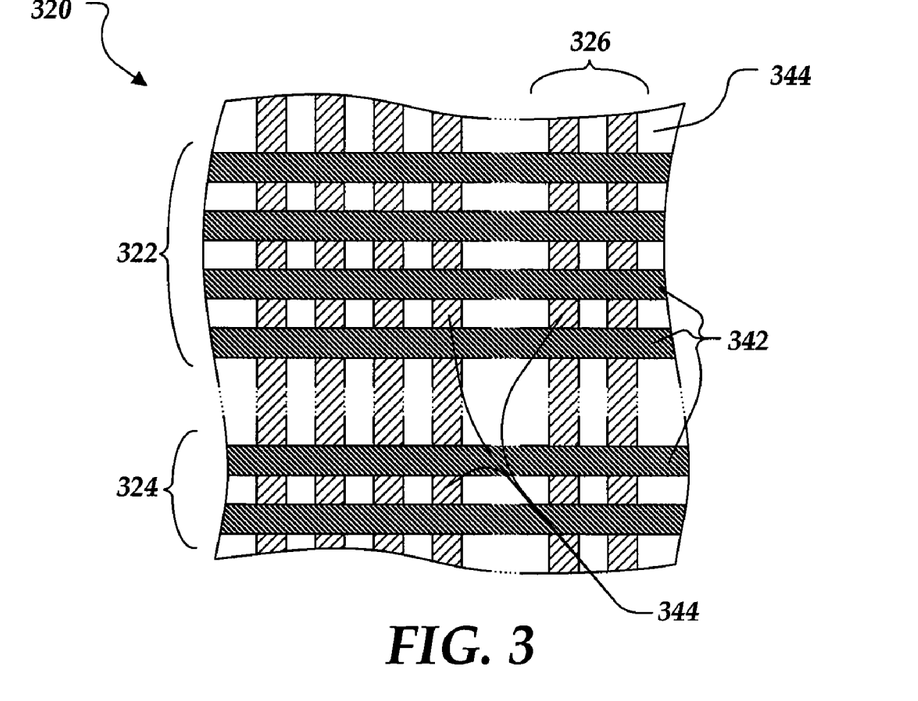
FIG. 3 is a partial top plan view of an embodiment of a memory sector.

FIG. 3 shows a partial top plan view of a sector that may be employed as an embodiment of sector 120 of FIG. 1. Sector 320 includes core cell arrays 322, redundant cell arrays 324, and dynamic reference cell arrays 326. Sector 320 also includes access lines 342, conductive regions 344, and a portion of substrate 340. Access lines 342 can include, for example, word lines and source gate lines. Portions of conductive regions 344 can include, for example, p-type and/or n-type doped regions of substrate 340 for forming source/drain regions and/or access lines. Also, in some embodiments, individual conductive regions 344 extend underneath individual access lines 342.

In many embodiments, individual access lines 342 are polysilicon, and conductive regions 344 form portions of bit lines and/or common source lines (e.g., in a NOR topology). In general, portions of access lines 342 are coupled to the gates of individual memory cells (not shown in FIG. 3). In one embodiment, individual memory cells are arranged in a NAND topology and can be accessed though individual conductive regions 344 collectively but not individually. In another embodiment, individual memory cells are arranged in a NOR topology and can be individually accessed via individual conductive regions 344. In some embodiments, individual memory cells have common source/drain regions located at individual conductive regions 344. In general, the pitch (or spacing) associated with access lines 342 and conductive regions 344 depend on the architecture of sector 320. For example, a NAND-based architecture generally has a smaller pitch than a NOR-based architecture.

Figure 4:
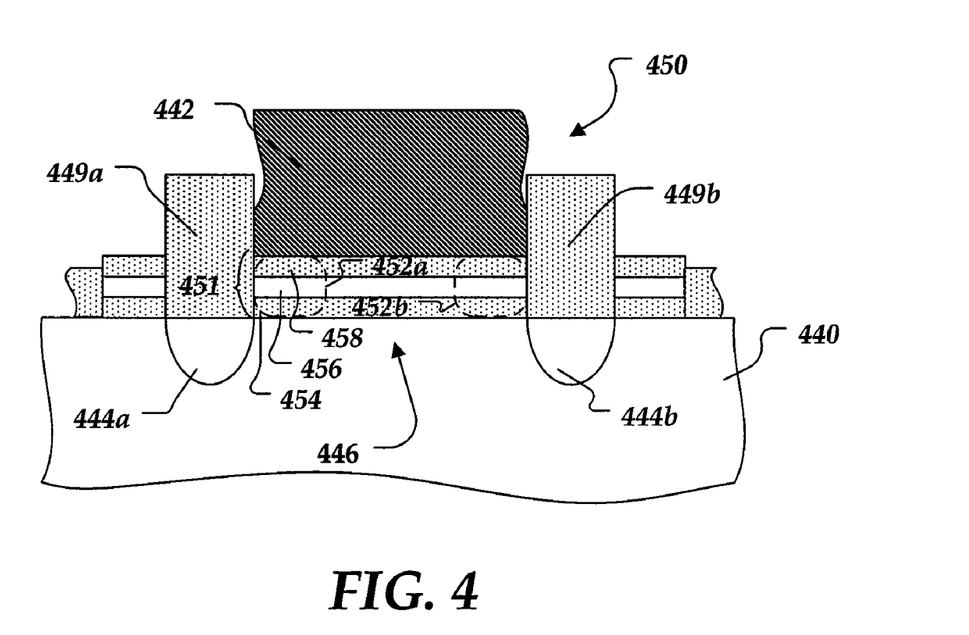
FIG. 4 is a cross-sectional side view of an embodiment of a dual-bit memory cell.

FIG. 4 shows a cross-sectional side view of a dual-bit memory cell that may be employed in an embodiment of sector 320 of FIG. 3, and which may also be employed in any one of core memory cells 250*a*, redundant memory cells 250*b*, and/or dynamic reference cells 250*c* of FIG. 2.

Memory cell 450 includes charge trapping component 451, including complimentary bit (CB) 452*a* and normal bit (NB) 452*b*, and isolation dielectrics 449*a* and 449*b* adjacent to CB 452*a* and NB 452*b*, respectively. Memory cell 450 also includes a channel region 446 located in a portion of substrate 440, source/drain regions 444*a* and 444*b* located in another portion of substrate 440, and a portion of access line 442. Substrate 440 may be an embodiment of substrate 340 of FIG. 3. Source/drain regions 444*a* and 444*b* may be an embodiment of one or more conductive regions 344 of FIG. 3. Access line 442 may be an embodiment of an individual access line 342 of FIG. 3.

Charge trapping component 451 employs tunneling layer 454, charge trapping layer 456 positioned on tunneling layer 454, and dielectric layer 458 positioned on charge trapping layer 456. In general, tunneling layer 454 provides a tunneling barrier, charge trapping layer 456 is a non-conductive layer that stores a tunneled charge, and dielectric layer 458 electrically isolates charge trapping layer 456 from access line 442. In one embodiment, tunneling layer 454 and dielectric layer 458 include a silicon oxide material, such as thermally grown or deposited oxide, and charge trapping layer 456 includes a silicon nitride material, such as stochiometric or silicon rich silicon nitride. Also, although not illustrated, other configurations of charge trapping component 451 are possible. For example, a gate layer can interposed between complimentary bit 452*a* and normal bit 452*b* in some embodiments.

In operation, an individual one of CB 452*a* and NB 452*b* is "programmed" when it is trapping charge and "unprogrammed" when it is not trapping charge. In general, to inject or remove charge, a voltage is applied to access line 442 and another voltage is applied to at least one of CB 452*a* and NB 452*b*. In addition or alternatively, at least one of CB 452*a* and NB 452*b* can be grounded or floated. Also, in some embodiments, the body region of memory cell 450 can also be biased, grounded, or floated. In one embodiment, hot electron injection can be employed to inject or remove charge individually from CB 452*a* and NB 452*b*. In another embodiment, Fowler-Nordheim tunneling can be employed to inject or remove charge individually from chare CB 452*a* and NB 452*b*. Also, although generally described in the context of a dual-bit topology, other embodiments of CB 452*a* and NB 452*b* can store multiple logic (or bit) states. For example, one discrete amount of charge can indicate one logic state, and a larger or smaller amount of charge can indicate another logic state.

To determine whether CB 452*a* and NB 452*b* are programmed or unprogrammed, a voltage is applied to access line 442, another voltage is applied across source/drain regions 444*a* and 444*b*, and the current is measured to detect threshold voltages associated with CB 452*a* and/or CB 452*b*. In general, memory cell 450 has distinct IV characteristics, or turn-on behavior, for each combination of programmed and/or unprogrammed states of CB 452*a* and CB 452*b*.

Figure 5A:
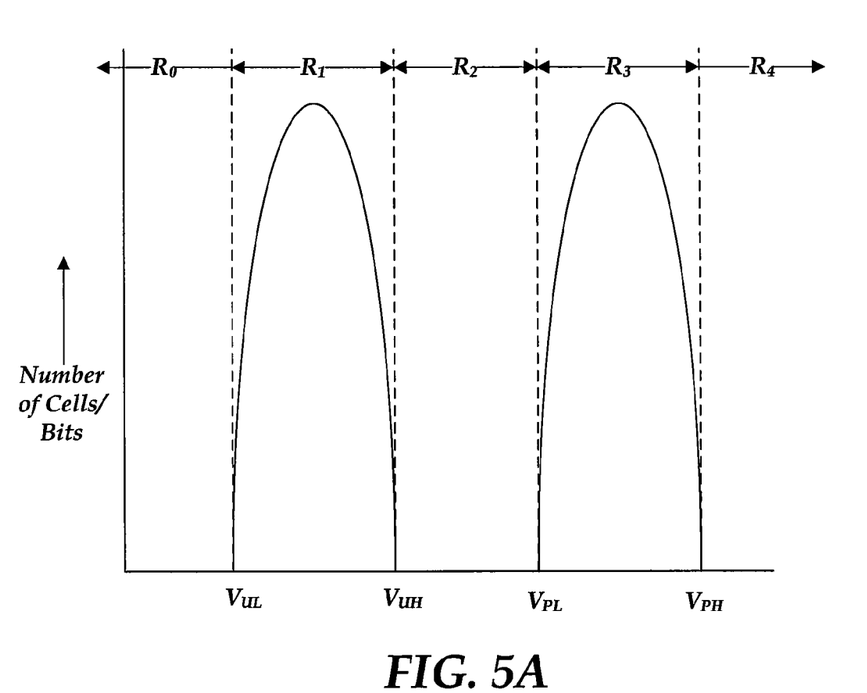
FIGS. 5A-C are plots showing threshold voltages of memory cells.

In general, processing variations during manufacturing create a distribution in the programmed and unprogrammed threshold voltages in a memory cell array/sector. FIG. 5A shows an example distribution $R_1$ of unprogrammed threshold voltage range $V_{UL}$-$V_{UH}$ and distribution $R_3$ of programmed threshold voltage range $V_{PL}$-$V_{PH}$ in a memory cell array/sector. FIG. 5A also shows region $R_0$ corresponding to over-erased memory cells, region $R_2$ corresponding to under-programmed memory cells, and region $R_4$ corresponding to over-programmed memory cells. In other embodiments, regions $R_0$-$R_4$ may be different span a larger or smaller range of voltages and/or different range of voltages dependent on the implementation of memory cells.

To compensate for processing variations, conventional dual-bit (or multi-bit) memory architectures employ external reference cells that contain the average values of the programmed and unprogrammed threshold voltages of a given memory cell array (or sector). Typically, the average programmed and unprogrammed threshold voltage are compared with the threshold voltages of a memory cell during reading and writing operations, and the average programmed and unprogrammed threshold voltages are reset (or re-averaged) during erasing operations.

Figure 5B:
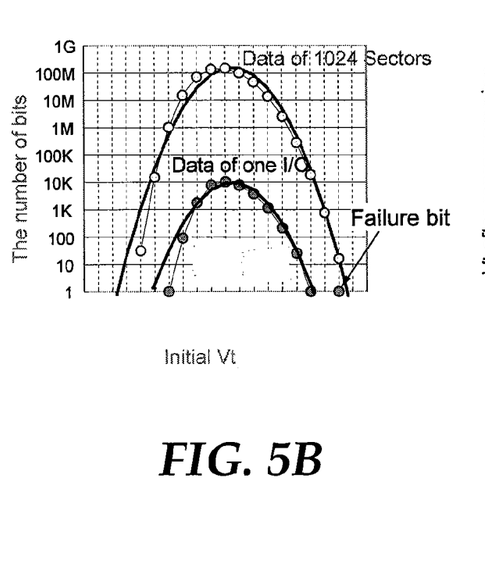

One particular problem with conventional memory architectures, however, is that some memory cells have outlayer threshold voltages. In general, these memory cells are referred to as failure bits because they fall outside of a distribution range, and thus, represent an erroneous logic state. FIG. 5B shows one example of an outlayer threshold voltage causing a failure bit.

Figure 5C:
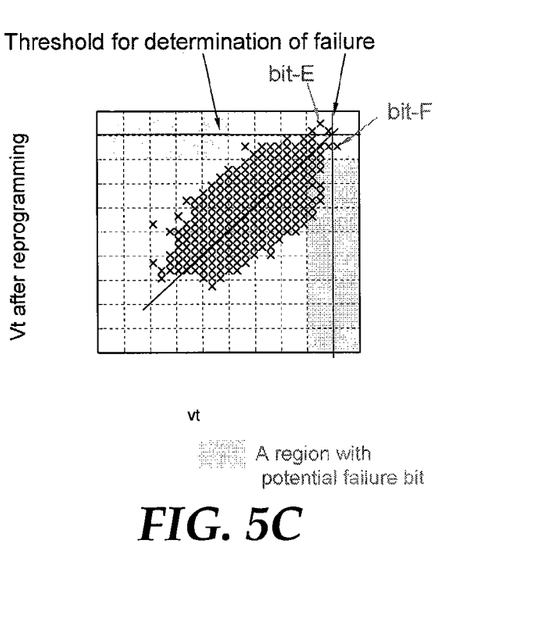

Outlayer threshold voltages are particularly problematic because they are difficult to account for due to their dynamic nature. An effect referred to as complimentary bit disturb (CBD) can cause threshold voltage outlayers when trapped charge at one bit of a memory cell affects the threshold voltage at another bit of the memory cell. For example, when the CB and NB elements of a memory cell are pre-programmed and erased, the threshold voltage of the CB element will change when the NB is programmed (or vice versa). FIG. 5C shows an example of a bit F that is in a failure state prior to a reprogramming (i.e., an erase process and a write process) and a different bit E that enters a failure state after the reprogramming.

Embodiments of memory 100, however, overcome various problems associated with CBD effects and other dynamic variations in threshold voltages. In particular, memory 100 employs one or more redundant memory cell arrays that can be dynamically assigned to a failed core cell array as replacement for the failed core cell array containing the failed memory cell. In one embodiment, redundant cell arrays are assigned during an erasing process. For example, when a memory cell is outside of a threshold voltage range, a redundant cell array can be assigned during under-erase verification. In one embodiment, the redundant cell array can be a temporary replacement that can be reassigned, for example, if a different core cell array fails. In another embodiment, the redundant cell array can be a permanent replacement, for example, if the failed core memory cell does not recover.

In general, a failed core cell array is identified as such if it contains one or more failed memory cells. In one embodiment, a memory cell is in a failed state if it has a threshold voltage residing in an over-erased region (e.g., region $R_0$ of FIG. 5A). In another embodiment, a memory cell is in a failed state if it has a threshold voltage residing in an under programmed region (e.g., region $R_2$ of FIG. 5A). In yet another embodiment, a memory cell is in a failed state if it has a threshold voltage residing in an over programmed region (e.g., region $R_4$ of FIG. 5A).

Figure 6:
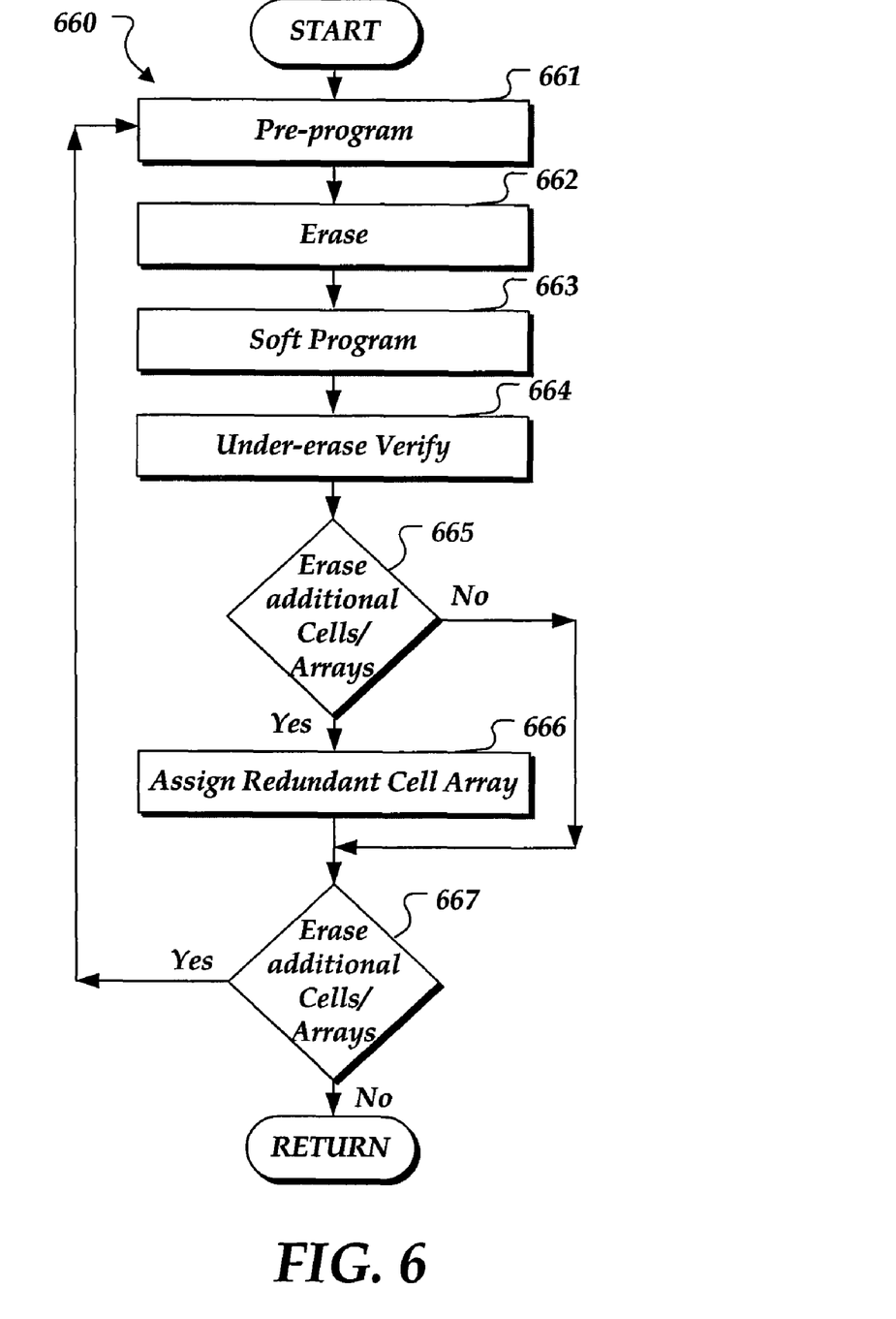
FIG. 6 is a flow diagram generally showing an embodiment of an erasing process.

FIG. 6 is a logical flow diagram generally showing one embodiment of an erasing process that assigns a redundant cell array to a failed core cell array. In one embodiment, memory controller 130 of FIG. 1 is configured to perform process 660 on one or more sectors 120 of FIG. 1. In another embodiment, memory controller 130 is configured to perform process 660 on a portion of one or more sectors 120. In general, each of blocks 661-666 can be performed sequentially on an individual memory cell, a grouping of memory cells within a core cell array, and/or a grouping of memory cells spanning several core cell arrays or a memory sector. However, in some embodiments, individual blocks can be performed in parallel and/or in a different order.

Process 660 begins, after a start block, at block 561, where one or more core memory cells undergoes pre-programming. Pre-programming generally involves programming core memory cells to be in a programmed state. For example, a core memory cell having one charge element in an unprogrammed state and another in a programmed state can be pre-programmed such that both charge elements are in a programmed state. In general, pre-programming is employed to prevent over erasure, which can create a low turn on voltage, causing a core memory cell to be put into a leakage state.

Process continues to block 662, where one or more core memory cells undergo erasing. Erasing generally involves removing charge from a core memory cell to bring the cell into an unprogrammed state. For example, both charge elements of a memory cell can be erased such that both charge elements are in an unprogrammed state.

Process continues to block 663, where one or more core memory cells undergo soft-programming. Soft programming generally involves correcting the threshold voltages of a memory cell by injecting charge. For example, one or both of the charge elements of a memory cell may have been over erased at block 662, and soft programming can be employed to increase the threshold voltages of the charge elements.

Process continues to block 664, where one or more core memory cells undergo under-erase verification. Under-erase verification generally involves detecting the threshold voltage of a memory cell to determine if soft programming has caused one or more charge elements of a memory cell to become programmed or under programmed. In some embodiments, threshold voltages may be compared to a predetermined threshold voltage range. In another embodiment, threshold voltages may be compared to an average threshold voltage of programmed core memory cells and/or unprogrammed memory cells. For example, as discussed above, external reference cells may be configured to determine the average threshold range and/or to account for changes in threshold voltage range over time due to memory cycling.

Figure 7A:
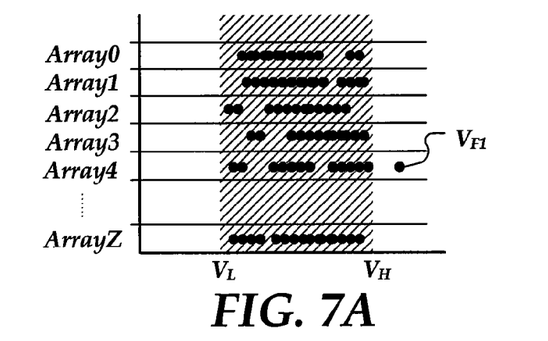
FIGS. 7A-D are scatter plots showing threshold voltages of core memory cells.

FIG. 7A is an example showing threshold voltages associated with core cell arrays array0-arrayZ after processing at block 664. Embodiments of core cell arrays array0-arrayZ can include for example, core cell arrays 122 of FIG. 1.

In the example of FIG. 7A, core cell arrays array0-array3 and array5-arrayZ have threshold voltages within threshold range $V_L$-$V_H$. However, array4 includes an outlayer threshold voltage $V_{F1}$ that is outside of threshold range $V_L$-$V_H$. For example, threshold voltage $V_{F1}$ may be in a programmed state or in an under programmed state.

Returning to FIG. 6, processing continue to decision block 665, where a determination is made as to whether a memory cell of a core cell array has failed based on under-erase verification. If a memory cell has failed, processing continues to block 666; otherwise processing flows to decision block 667.

At block 666, a redundant cell array is assigned to the core cell array that contains the failed memory cell. For example, referring to FIG. 7A, a redundant cell array can be assigned to core cell array4 because it contains outlayer threshold voltage $V_{F1}$. In one embodiment, a logic state can be written to a dynamic reference cell corresponding to the failed core cell array so that when the dynamic reference cell array is read, a memory controller employs the assigned redundant cell array for read/write access in lieu of the failed core cell array (described further with reference to FIG. 8 and FIG. 9).

In one embodiment, a dynamic reference cell can have a logic state that identifies whether a redundant cell array is to be employed. For example, the logic state "00" can indicate that the core cell array includes a failed memory cell and that a redundant memory cell is to be employed. In another embodiment, a dynamic reference cell can employ a different logic state and/or include addressing information if multiple redundant cell arrays are to be employed. For example, two or more dynamic reference cells can be employed to identify multiple failed core cell arrays and to identify a particular redundant cell array that is to be associated with each failed core cell array.

Processing continues to decision block 667. If additional core memory cells/arrays are to be erased, processing loops back to block 661; otherwise, processing flows to a calling process to perform other actions.

Figure 7B:
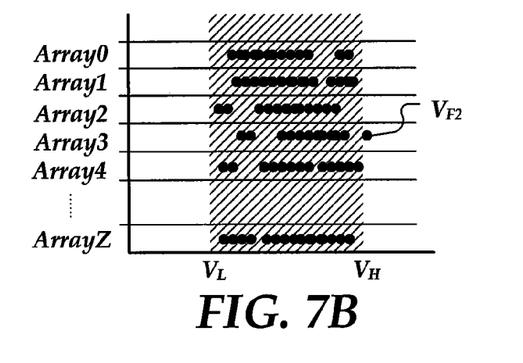
Figure 7C:
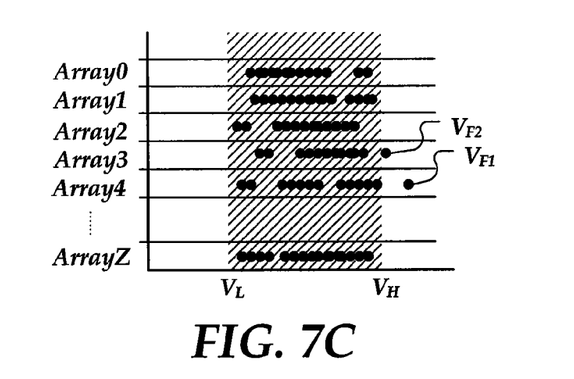
Figure 7D:
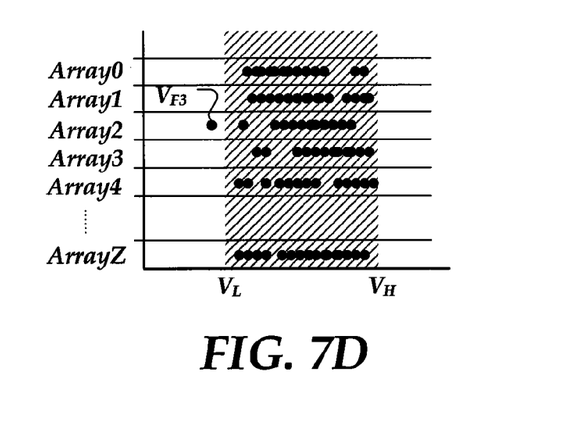

FIGS. 7B-7D are examples showing threshold voltages associated with core cell arrays array0-arrayZ after process 660 of FIG. 6 is repeated. Process 660 may be repeated, for example, when a memory sector or a portion of a memory sector is to be erased and re-written. Each of FIGS. 7B-7D reflect a dynamic assignment of a redundant cell array to a failed core cell array.

In the example of FIG. 7B, each of the threshold voltages associated with array4 are now within threshold range $V_L$-$V_H$, and array3 includes outlayer threshold voltage $V_{F2}$. Accordingly, at block 666 of process 660, a redundant cell array may be assigned (or re-assigned) to array3, and array4 may no longer be associated with a redundant cell array.

In the example of FIG. 7C, array4 includes outlayer threshold voltage $V_{F1}$ and array3 includes outlayer threshold voltage $V_{F2}$. Accordingly, at block 666 of process 660, a redundant cell array may be assigned to array4 and another redundant cell array may be assigned to array3. In other embodiments, however, a memory sector or block may only include one redundant cell array, and therefore, may only assign only one of array4 or array3 to a redundant cell array. In such embodiments, the redundant cell array may be assigned based on one or more factors including the following: the extent to which a threshold surpasses a threshold or threshold range, the first core cell array to report a failed memory cell, the last core cell array to report a failed memory cell, and/or other criterion.

In the example of FIG. 7D, array2 includes outlayer threshold voltage $V_{F3}$. Accordingly, at block 666 of process 660, a redundant cell array may be assigned to array2. Outlayer $V_{F3}$ may occur, for example, when a core memory cell is over-erased and/or not sufficiently soft programmed. A redundant cell array may be employed to in this example to reduce a leakage current that could occur at the failed memory cell.

Figure 8:
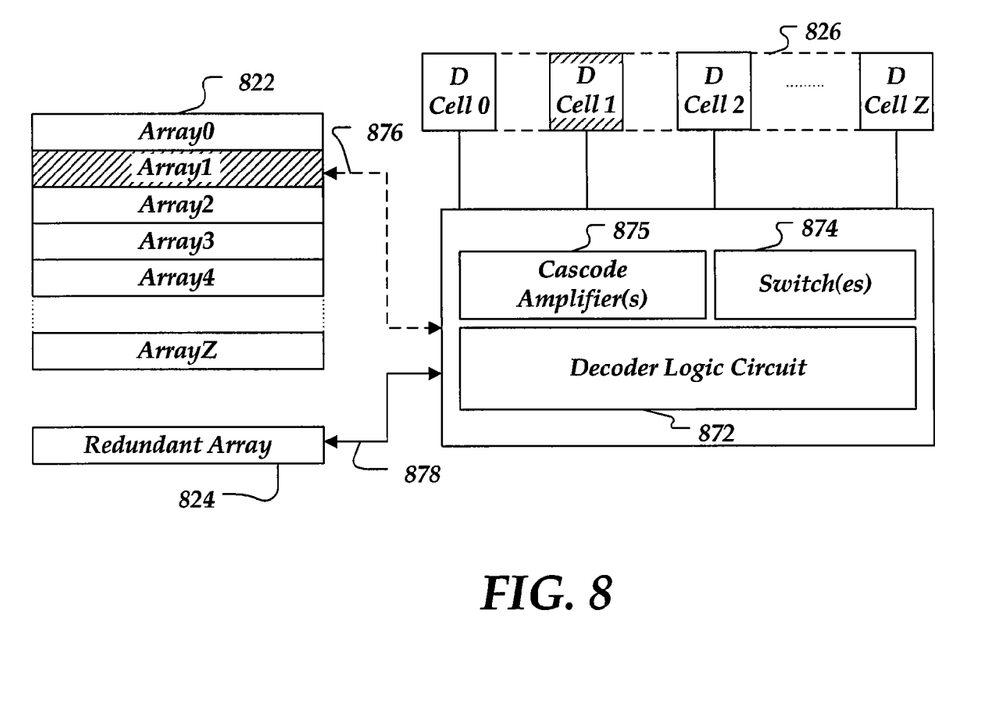
FIG. 8 is a conceptual block diagram showing an embodiment of read/write access.

FIG. 8 shows one embodiment of read/write access to a redundant cell array. As shown, logic decoder circuit 872 is configured to address core cell arrays 822 and/or redundant cell array 824 based on dynamic reference cell array 826. In some embodiments, logic decoder circuit 872 is also configured to select individual cells within an array and/or to select individual sectors within an arrayed memory (not shown in FIG. 8). In one embodiment, core cell arrays 822, redundant cell array 824, and dynamic reference cell array 826 are an embodiment of core cell arrays 122, redundant cell array 124, and dynamic reference cell array 126 of FIG. 1, respectively Logic decoder circuit 872 is configured to read memory cells/arrays via switch circuits 874, and cascode amplifiers 875. In one embodiment, logic decoder circuit 872, switch circuits 874, and cascode amplifiers 875 form at least a portion of memory controller 130 and/or line/sector control circuit 115 of FIG. 1. In one embodiment, logic decoder circuit 872 includes portions of decoder circuit 132 and controller circuit 136.

In general, logic decoder circuit 872 can address core cell arrays 822 in a normal fashion when a core cell array is not in a failure state. For example, logic decoder circuit 872 can provide read/write access via signal path 876 to core cell array1 when it is not in a failure state. However, logic decoder circuit 872 can employ a different address based on the logic states of dynamic reference cells 826. For example, when dynamic reference cell 1 indicates that array1 is in a failed state (i.e., includes a failed memory cell), logic decoder circuit 872 addresses redundant cell array 824 via signal path 878 in lieu of signal path 876. Also, if array1 recovers (and dynamic reference cell 1 indicates such), array1 may again be addressed in a normal fashion via signal path 876.

In one embodiment, logic decoder circuit 872 may employ state machine 136 of FIG. 1 to determine whether an individual array of core cell array 822 is to be addressed or whether redundant cell array 824 is to be addressed in lieu of a core cell array. In another embodiment, logic decoder circuit 872 can be configured to read a dynamic reference cell such that addressing is determined each time a core memory array (or cell) is attempted to be accessed.

Figure 9:
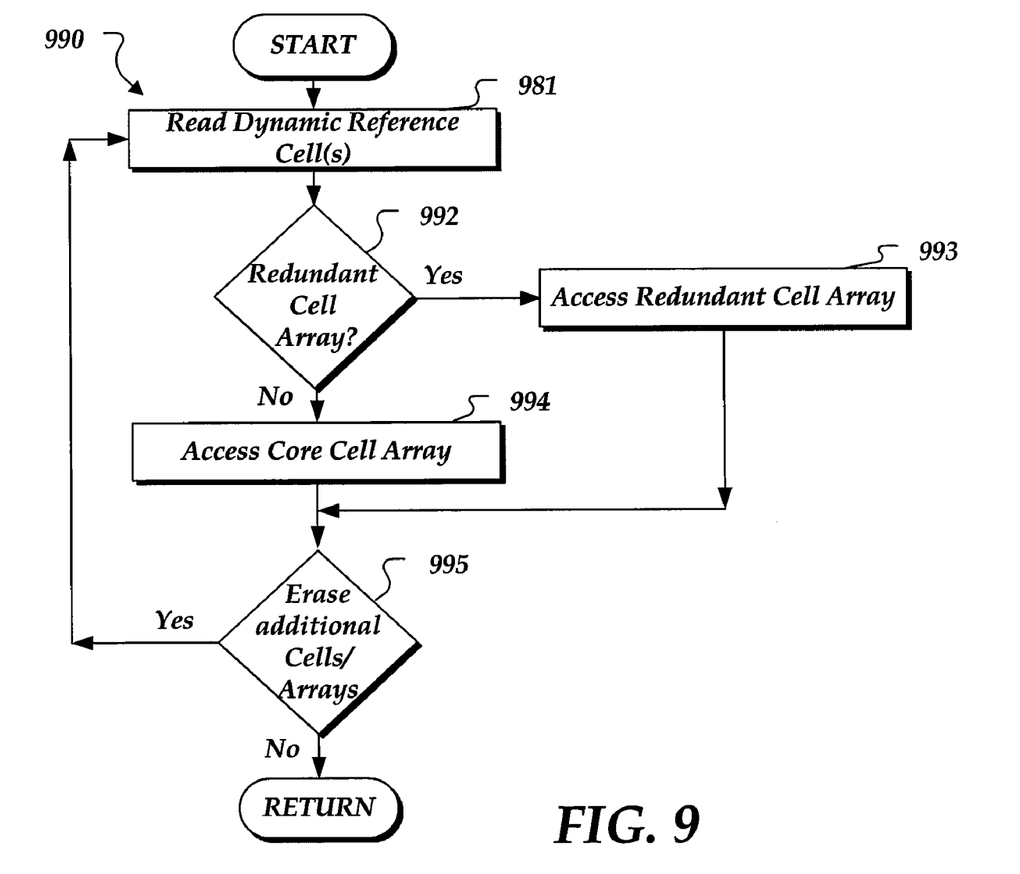
FIG. 9 is a flow diagram generally showing an embodiment of read/write access.

FIG. 9 is a logical flow diagram generally showing one embodiment of a process for read/write accessing a core cell array and/or a redundant cell array. In one embodiment, logic decoder circuit 872 of FIG. 8 is configured to perform process 980 on one or more sectors 120 of FIG. 1. In another embodiment, logic decoder circuit 872 is configured to perform process 980 on a portion of one or more sectors 120. In general, each of blocks 981-984 can be performed sequentially on an individual memory cell, a grouping of memory cells within a core cell array, and/or a grouping of memory cells spanning several core cell arrays or a memory sector. However, in some embodiments, individual blocks can be performed in parallel and/or in a different order.

Process 980 begins, after a start block, at block 981, where one or more dynamic reference cells are read. In one embodiment, an individual dynamic reference cell may be read when an individual core cell array is accessed. In another embodiment, each dynamic reference cell of a dynamic cell array may be read before accessing a core cell array. For example, logic decoder circuit 872 of FIG. 8 may load the values of dynamic reference cells into temporary memory for addressing core cells arrays during a read/write access session.

Processing continues next to decision block 992, where the logic state of one or more dynamic reference cells is determined. If the logic state indicates that a redundant cell array is to be employed processing continues to decision block 993; otherwise, processing continues to block 994.

If processing continues to block 983, a redundant cell array is accessed based on the logic state of a dynamic reference cell and in lieu of a failed core cell array. In one embodiment, one or more memory cells of a redundant cell array may be read from in lieu of a failed core cell array. In another embodiment, one or more memory cells of a redundant cell array may be written to in lieu of a failed core cell array.

If processing continues to block 994, a core cell array is accessed for read/write access and a redundant cell array is not used in place of the core cell arrays.

Processing continues to decision block 995. If additional core memory cells/arrays are to be accessed, processing loops back to block 981; otherwise processing flows to a calling process to perform other actions.

Figure 10:
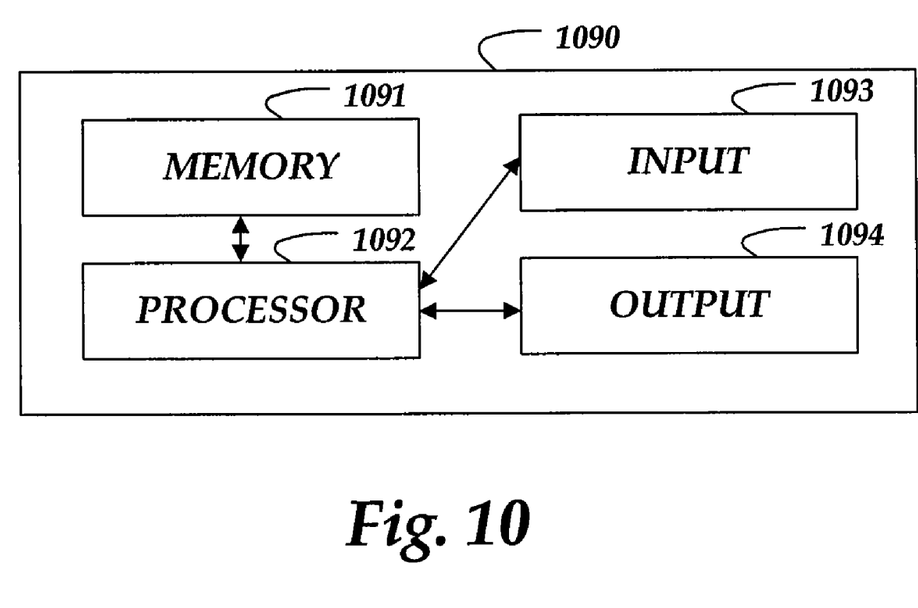
FIG. 10 is a block diagram of a system that may incorporate embodiments of redundant cell arrays.

Embodiments of redundant cell arrays and/or dynamic reference cell arrays can be incorporated into any of a variety of components and/or systems. FIG. 10 shows one embodiment of a system (1090) that may redundant cell arrays and/or dynamic reference cell arrays in memory 1091. Memory 1091 may include, for example, any one of the aforementioned memories, such as memory 1000 of FIG. 1. Memory 1091 can be directly or indirectly coupled to any one of processor 1092, input devices 1093, and/or output devices 1094. In one embodiment, memory 1091 may be configured such that it is removable from system 1090. In another embodiment, memory 1091 may be permanently connected to the components or a portion of the components of the system 1090.

In many embodiments, memory 1091, processor 1092, input devices 1093, and/or output devices 1094 of system 1090 are configured in combination to function as part of a larger system. For example, system 1090 may be incorporated into a cell phone, a handheld device, a laptop computer, a personal computer, and/or a server device. In addition or alternatively, system 1090 can perform any of variety of processing, controller, and/or data storage functions, such as those associated with sensing, imaging, computing, or other functions. Accordingly, system 1090 can be incorporated into any of wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory, comprising:
   a plurality of core cell arrays of multi-bit memory cells;
   at least one redundant cell array; and
   a memory controller that is configured to dynamically assign the redundant cell array to a failed core cell array of at least a portion of the plurality of core cell arrays when erasing the portion of core cell arrays, wherein the memory controller is further configured to provide access to the redundant cell array when the failed core cell array is selected for read/write access.

2. The memory of claim 1, further comprising at least one dynamic reference cell array, wherein the memory controller is further configured to identify the failed core cell array by writing a logic state to the dynamic reference cell array.

3. The memory of claim 1, wherein the core cell arrays and the redundant cell array each include a plurality of dual-bit memory cells.

4. The memory of claim 1, wherein the plurality of core cell arrays includes at least one of a NOR configuration or a NAND configuration.

5. The memory of claim 1, wherein the memory controller is further configured to dynamically assign the redundant cell array to another failed core cell array of the plurality of core cell arrays based, at least in part, on under-erase verification.

6. The memory of claim 1, wherein the memory controller is further configured to soft program the portion of the plurality of core cell arrays, erase the portion of the plurality of core cell arrays, and under-erase verify the portion of the plurality of core cell arrays to identify a failed memory cell of the failed core cell array.

7. The memory of claim 1, wherein the memory controller is configured to identify the failed core cell array based on one or more threshold voltages of a failed memory cell of the failed core cell array.

8. A memory, comprising:
   a plurality of core cell arrays of multi-bit memory cells;
   at least one redundant cell array;
   a memory controller that is configured to dynamically assign the redundant cell array to a failed core cell array of at least a portion of the plurality of core cell arrays when erasing the portion of core cell arrays, wherein the memory controller is further configured to provide access to the redundant cell array when the failed core cell array is selected for read/write access;
   a plurality of dynamic reference cells, wherein each dynamic reference cell of the plurality of dynamic reference cells corresponds to a core cell array of the plurality of core cell arrays;
   a plurality of access lines, wherein each core cell array of the plurality of core cell arrays is coupled to at least one access line of the plurality of access lines; and
   a plurality of bit lines, wherein each cell of the redundant cell array is coupled to a corresponding core cell of the plurality of core cell arrays via one or more bit lines of the plurality of bit lines.

9. A memory, comprising:
   a plurality of core cell arrays of multi-bit memory cells;
   at least one redundant cell array;
   a memory controller that is configured to dynamically assign the redundant cell array to a failed core cell array of at least a portion of the plurality of core cell arrays when erasing the portion of core cell arrays, wherein the memory controller is further configured to provide access to the redundant cell array when the failed core cell array is selected for read/write access;
   a plurality of dynamic reference cells, wherein the memory controller includes one of:
   means for addressing the plurality of core cell arrays based, at least in part, on logic states associated with the plurality of dynamic reference cells;
   or
   means for at least one of reading from or writing to the plurality of core cell arrays and the redundant cell array based, at least in part, on the logic states associated with the plurality of dynamic reference cells.

10. A memory, comprising:
    a plurality of cell arrays of multi-bit memory cells, wherein each cell array of the plurality of cell arrays includes at least one dynamic reference cell;
    at least one redundant cell array; and
    a memory controller coupled to the plurality of cell arrays and the redundant cell array, wherein the memory controller is configured to perform actions, including:
    selecting a cell array from the plurality of cell arrays;
    reading a dynamic reference cell of the selected cell array;
    determining if a logic state of the dynamic reference cell indicates a failure state; and
    selecting the redundant cell array and providing read/write access to the redundant cell array based on the logic state.

11. The memory of claim 10, wherein selecting the redundant cell array includes providing read/write access to the redundant cell array in lieu of read/write access to the selected cell array.

12. The memory of claim 11, wherein the memory controller actions further include:
    erasing the plurality of cell arrays and the redundant cell array;
    soft programming at least a portion of the plurality of cell arrays and the redundant cell array; and
    identifying a different cell array of the plurality of cell arrays as containing a failed cell based, at least in part, on an under-erase verification.

13. The memory of claim 10, wherein the memory controller further comprises a decoder circuit, and wherein the memory controller actions further include employing the decoder circuit to select the redundant cell array based on the logic state of the dynamic reference cell.

14. The memory of claim 10, further comprising a plurality of memory sectors, wherein the plurality of cell arrays is associated with a memory sector of the plurality of memory sectors, and wherein the memory controller actions further include selecting the memory sector.

15. A memory controller, comprising:
   a decoder circuit; and
   a controller circuit coupled to the decoder circuit, wherein the controller circuit is configured to perform actions, including:
      soft-programming a plurality of core cell arrays of multi-bit memory cells;
      under-erase verifying each core cell of the plurality of core cell arrays such that if a core cell exceeds a threshold voltage, the core cell array of the failed core cell is identified by writing a logic state to a corresponding dynamic reference cell.

16. The memory controller of claim 15, wherein the controller circuit actions further include:
   pre-programming at least a portion of the core cell arrays; and
   erasing the portion of the plurality of the core cell arrays prior to the soft-programming of the plurality of core cell arrays.

17. The memory controller of claim 15, wherein the controller circuit actions further include identifying a different core cell array during another under-erase verification process by writing a logic state to another dynamic reference cell.

18. The memory controller of claim 15, wherein writing the logic state to the dynamic reference cell includes writing a logic state to a dual-bit memory cell.

19. The memory controller of claim 15, wherein the memory controller is configured to read/write at least one of a NOR-based arrayed memory or NAND-based arrayed memory.

20. The memory controller of claim 15, wherein the decoder circuit is configured to perform actions, including receiving a memory address associated with the core cell array of the failed core cell and decoding the memory address based on the logic state of the dynamic reference cell.

* * * * *

UNITED STATES PATENT AND TRADEMARK OFFICE
CERTIFICATE OF CORRECTION

| | |
|---|---|
| PATENT NO. | : 8,072,802 B2 |
| APPLICATION NO. | : 12/329475 |
| DATED | : December 6, 2011 |
| INVENTOR(S) | : Keiichiro Kikuchi et al. |

It is certified that error appears in the above-identified patent and that said Letters Patent is hereby corrected as shown below:

In column 6, line 19, delete "stochiometric" and insert -- stoichiometric --, therefor.

In column 9, line 53, after "respectively" insert -- . --.

Signed and Sealed this
Twenty-sixth Day of June, 2012

David J. Kappos
*Director of the United States Patent and Trademark Office*